(12) United States Patent
Lee

(10) Patent No.: US 7,535,740 B2
(45) Date of Patent: May 19, 2009

(54) ELECTRONIC APPARATUS AND POWER CIRCUIT HAVING REDUCED SWITCHING LOSS

(75) Inventor: Won-kyoung Lee, Suwon-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 265 days.

(21) Appl. No.: 11/546,438

(22) Filed: Oct. 12, 2006

(65) Prior Publication Data

US 2007/0121356 A1 May 31, 2007

(30) Foreign Application Priority Data

Nov. 29, 2005 (KR) .................. 10-2005-0114824

(51) Int. Cl.
*H02M 7/5387* (2007.01)
(52) U.S. Cl. ........................................ 363/98; 363/132
(58) Field of Classification Search .................. 363/95, 363/97, 98, 132
See application file for complete search history.

(56) References Cited

U.S. PATENT DOCUMENTS

| | | | | |
|---|---|---|---|---|
| 5,216,587 | A * | 6/1993 | Miyazaki et al. | 363/56.02 |
| 5,969,964 | A | 10/1999 | Mangtani | |
| 5,977,814 | A * | 11/1999 | Ishii | 327/434 |
| 6,147,887 | A * | 11/2000 | Miettinen | 363/98 |
| 6,392,908 | B2 * | 5/2002 | Miyazaki et al. | 363/98 |
| 6,580,627 | B2 * | 6/2003 | Toshio | 363/98 |
| 6,636,024 | B2 * | 10/2003 | Zametzky | 323/282 |
| 2003/0156439 | A1 * | 8/2003 | Ohmichi et al. | 363/98 |
| 2006/0034107 | A1 * | 2/2006 | West | 363/98 |

FOREIGN PATENT DOCUMENTS

| | | |
|---|---|---|
| EP | 0 703 664 A2 | 3/1996 |
| EP | 0 998 018 A1 | 5/2000 |
| GB | 2 324 664 A | 10/1998 |

OTHER PUBLICATIONS

Chaofeng Huang, et al., "Low Jitter and Drift High Voltage IGBT Gate Driver", CYMER, Inc., Digest of Technical Papers, vol. 2 of 2, Conf. 14, Jun. 2003, pp. 127-130, XP010690168, ISBN: 0-7803-7915-2.

European Search Report Communication issued by the European Patent Office on Mar. 29, 2007, in European Application No. 06124413.3—2207 (10 pages).

* cited by examiner

*Primary Examiner*—Jeffrey L Sterrett
(74) *Attorney, Agent, or Firm*—Staas & Halsey LLP

(57) ABSTRACT

An electronic apparatus having a load including: a power supply unit supplying a driving voltage to the load; an inverter unit switching the driving voltage; and a control voltage supply unit outputting a first control voltage lower than a reference voltage applied to one terminal of the inverter unit, and a second control voltage higher than the reference voltage, thus controlling the inverter unit. Thus, the electronic apparatus and power circuit are capable of improving a control voltage applied to an inverter unit to reduce the switching loss of the inverter unit.

18 Claims, 6 Drawing Sheets

ELECTRONIC APPARATUS AND POWER CIRCUIT HAVING REDUCED SWITCHING LOSS

CROSS-REFERENCE TO RELATED APPLICATIONS

This application claims priority from Korean Patent Application No. 2005-0114824, filed on Nov. 29, 2005, in the Korean Intellectual Property Office, the disclosure of which is incorporated herein by reference.

BACKGROUND OF THE INVENTION

1. Field of the Invention

The present invention relates to an electronic apparatus and a power circuit, and more particularly, to an electronic apparatus and a power circuit for improving a control voltage applied to an inverter unit.

2. Description of the Related Art

Referring to FIG. 1A, a conventional electronic apparatus includes a load 190, a power supply unit 170 for supplying a driving voltage to the load 190, an inverter unit 150 for controlling the level of the driving voltage applied to the load 190 by switching the driving voltage, and a control voltage supply unit 130 for outputting a control voltage to the inverter unit 150.

In the conventional electronic apparatus, the control voltage supply unit 130 includes a high-side control voltage output unit 133 and a low-side control voltage output unit 131, and the inverter unit 150 includes a high-side transistor Q11 and a low-side transistor Q12. Here, the high-side control voltage output unit 133 and the low-side control voltage output unit 131 apply a high signal and a low signal to the inverter unit 150 according to a predetermined control signal. The high-side and low-side transistors Q11 and Q12 of the inverter unit 150 are switched according to the high signal and the low signal output from the control voltage output units 131 and 133.

Here, voltages of the high and low signals output from the high-side control voltage output unit 133 are respectively V5 and V3, and voltages of the high and low signals output from the low-side control voltage output unit 131 are respectively Vcc and V1. A voltage applied to the emitter terminal of the high-side transistor Q11 is V3 and a voltage applied to the emitter terminal of the low-side transistor Q12 is V1. As such, if a control signal applied to the inverter unit 150 is "low", voltages applied to the emitter terminals of the high-side and low-side transistors Q11 and Q12 are equal to voltages output from the control voltage output units 131 and 133 respectively.

In the conventional electronic apparatus, as the capacity of an inverter increases, the switching loss of the corresponding transistors gradually increases. Accordingly, it is required to reduce such switching loss.

SUMMARY OF THE INVENTION

Accordingly, it is an aspect of the present invention to provide an electronic apparatus and a power circuit which are capable of improving a control voltage applied to an inverter unit to thus reduce the switching loss of the inverter unit.

The foregoing and/or other aspects of the present invention can be achieved by providing an electronic apparatus having a load including: a power supply unit supplying a driving voltage to the load; an inverter unit switching the driving voltage; and a control voltage supply unit outputting a first control voltage lower than a reference voltage applied to one terminal of the inverter unit, and a second control voltage higher than the reference voltage, thus controlling the inverter unit.

According to another aspect of the present invention, the inverter unit includes at least one transistor having a base terminal, an emitter terminal, and a collector terminal, the reference voltage is a voltage of the emitter terminal of the transistor, and the first control voltage and the second control voltage are applied to the base terminal of the transistor.

According to another aspect of the present invention, the control voltage supply unit includes a control voltage output unit including a first voltage terminal for deciding the first control voltage and a second voltage terminal for deciding the second control voltage.

According to another aspect of the present invention, the control voltage supply unit includes a voltage difference deciding unit whose cathode is connected to the emitter terminal of the transistor and whose anode is connected to the first voltage terminal, to decide a voltage difference between a voltage of the emitter terminal of the transistor and a voltage of the first voltage terminal.

According to another aspect of the present invention, the voltage difference deciding unit includes at least one of a zener diode and a capacitor.

According to another aspect of the present invention, the inverter unit includes a high-side inverter unit and a low-side inverter unit, and the control voltage output unit includes, a high-side control voltage output unit outputting a first high-side control voltage lower than a high-side reference voltage and a second high-side control voltage higher than the high-side reference voltage, to the high-side inverter unit, and including a first high-side voltage terminal for deciding the first high-side control voltage and a second high-side voltage terminal for deciding the second high-side control voltage, and a low-side control voltage output unit outputting a first low-side control voltage lower than a low-side reference voltage and a second low-side control voltage higher than the low-side reference voltage, to the low-side inverter unit, and including a first low-side voltage terminal for deciding the first low-side control voltage and a second low-side voltage terminal for deciding the second low-side control voltage.

According to another aspect of the present invention, the high-side inverter unit includes a high-side transistor, and the low-side inverter unit includes a low-side transistor.

According to another aspect of the present invention, the control voltage supply unit further includes a controller which controls the low-side control voltage output unit to output the second low-side control voltage if the high-side control voltage output unit outputs the first high-side control voltage, and controls the low-side control voltage output unit to output the first low-side control voltage if the high-side control voltage output unit outputs the second high-side control voltage.

According to another aspect of the present invention, the voltage difference deciding unit is provided in correspondence to at least one of the low-side control voltage output unit and the high-side control voltage output unit.

According to another aspect of the present invention, the voltage difference deciding unit includes a low-side voltage difference deciding unit provided in the low-side control voltage output unit and a high-side voltage difference deciding unit provided in the high-side control voltage output unit.

According to another aspect of the present invention, the control voltage supply unit includes a switching unit which is serial-connected to an output terminal of the low-side control voltage output unit and one terminal of the high-side voltage difference deciding unit, and the high-side voltage difference deciding unit includes a capacitor which is charged when the second low-side control voltage is output.

According to another aspect of the present invention, the first high-side control voltage is lower by a voltage charged in the capacitor than a voltage of the emitter terminal of the high-side transistor.

According to another aspect of the present invention, the low-side voltage difference deciding unit includes a zener diode, and a voltage of one terminal of the low-side voltage difference deciding unit is lower by a voltage applied to the zener diode than a voltage of the emitter terminal of the low-side transistor.

According to another aspect of the present invention, the control voltage supply unit includes a voltage source supplying a voltage to the second high-side voltage terminal and the second low-side voltage terminal.

According to another aspect of the present invention, the voltage source is connected in parallel to the low-side voltage difference deciding unit.

According to another aspect of the present invention, the transistor includes an Insulated Gate Bipolar Transistor (IGBT).

According to another aspect of the present invention, the load includes a motor.

According to another aspect of the present invention, the motor includes a three-phase motor, and the controller controls the control voltage output unit, to output a control voltage for providing a three-phase current to respective phase terminals of the three-phase motor, to the inverter unit.

The foregoing and/or other aspects of the present invention can be achieved by providing a power circuit including: a power supply unit supplying a driving voltage to a load; an inverter unit switching the driving voltage; and a control voltage supply unit outputting a first control voltage lower than a reference voltage applied to one terminal of the inverter unit and a second control voltage higher than the reference voltage, thus controlling the inverter unit.

According to another aspect of the present invention, the inverter unit includes at least one transistor having a base terminal, an emitter terminal, and a collector terminal, the reference voltage is a voltage of the emitter terminal of the transistor, and the first control voltage and the second control voltage are applied to the base terminal of the transistor.

According to another aspect of the present invention, the control voltage supply unit includes a control voltage output unit including a first voltage terminal for deciding the first control voltage and a second voltage terminal for deciding the second control voltage.

According to another aspect of the present invention, the control voltage supply unit includes a voltage difference deciding unit whose cathode is connected to the emitter terminal of the transistor and whose anode is connected to the first voltage terminal, to decide a voltage difference between a voltage of the emitter terminal of the transistor and a voltage of the first voltage terminal.

According to another aspect of the present invention, the voltage difference deciding unit includes at least one of a zener diode and a capacitor.

According to another aspect of the present invention, the transistor includes an Insulated Gate Bipolar Transistor (IGBT).

Additional aspects and/or advantages of the invention will be set forth in part in the description which follows and, in part, will be apparent from the description, or may be learned by practice of the invention.

BRIEF DESCRIPTION OF THE DRAWINGS

The above and/or other aspects and advantages of the prevent invention will become apparent and more readily appreciated from the following description of the exemplary embodiments, taken in conjunction with the accompany drawings, in which.

DETAILED DESCRIPTION OF THE PREFERRED EMBODIMENTS

Figure 1A:
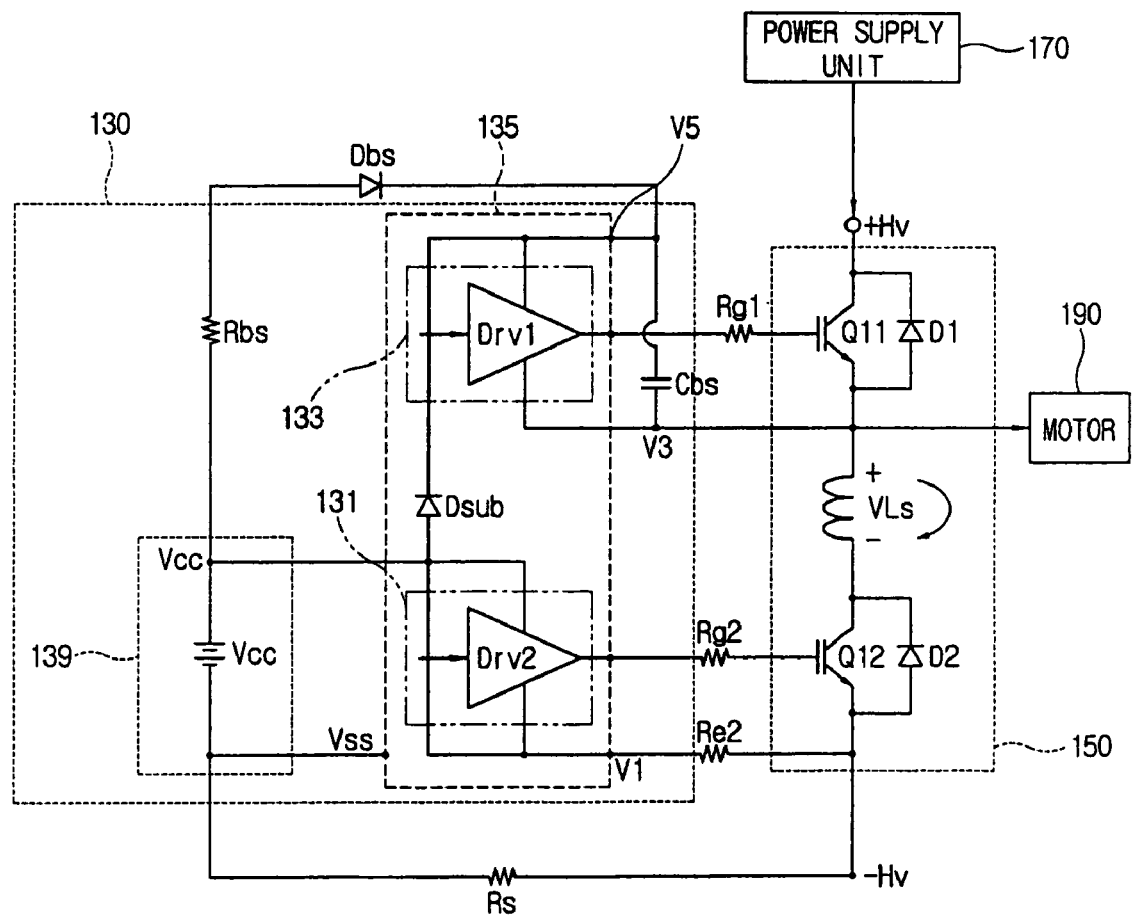
FIG. 1A is a control block diagram of an electronic apparatus including a conventional power circuit and a motor.

Reference will now be made in detail to the embodiments of the present invention, examples of which are illustrated in the accompanying drawings, wherein like reference numerals refer to like elements throughout. The embodiments are described below so as to explain the present invention by referring to the figures.

Figure 2:
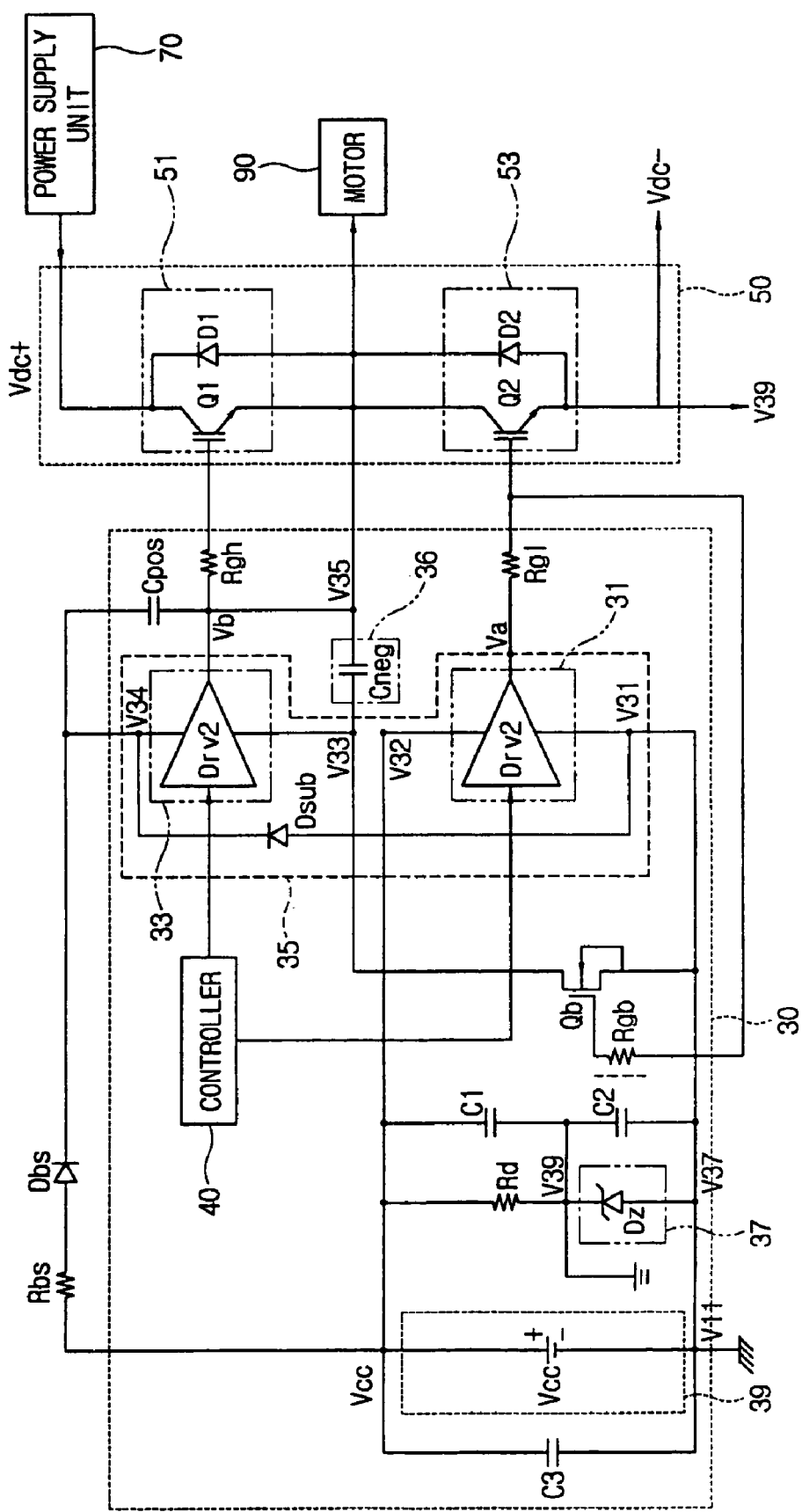
FIG. 2 is a control block diagram of an electronic apparatus including a power circuit and a motor, according to an embodiment of the present invention.

Referring to FIG. 2, an electronic apparatus according to the present invention includes a load 90 and a power circuit.

Here, the power circuit includes a power supply unit 70 for supplying a driving voltage to the load 90, an inverter unit 50 for switching the driving voltage, and a control voltage supply unit 30 for outputting a control signal for controlling the inverter unit 50.

The load 90 performs a predetermined function, and receives the driving voltage from the power supply unit 70 of the power circuit so that the load 90 is driven. Here, the load 90 may be a motor. However, the load 90 may be a fan, a lamp, etc. Hereinafter, it is assumed that the load 90 is a motor.

The inverter unit 50 switches the driving voltage supplied from the power supply unit 70 and adjusts the level of the driving voltage to be applied to the motor 90. The inverter unit 50 may include a high-side inverter unit 51 and a low-side inverter unit 53. Here, the inverter unit 50 converts a DC voltage received from the power supply unit 70 into an AC voltage and outputs the AC voltage to the motor 90.

In detail, the inverter unit 50 may include a plurality of transistors and adjust the amplitude of a driving current by the on/off operations of the transistors.

The inverter unit 50 may include a pair of switching units, for example, transistors Q1 and Q2, with respect to a phase of the received control signal. Accordingly, if the motor 90 is a three-phase motor, the inverter unit 50 may include three pairs of transistors. Here, a case where the electronic apparatus according to the present invention includes a three-phase motor will be described later with reference to FIG. 3. Each transistor includes a base terminal, an emitter terminal, and a collector terminal, and a voltage applied to the emitter terminal of each transistor is a reference voltage. The transistor may be a Insulated Gate Bipolar Transistor (IGBT). Here, the high-side inverter unit 51 may include a high-side transistor Q1 and the low-side inverter unit 53 may include a low-side transistor Q2.

A control voltage output from a high-side control voltage output unit 33 to be described later is applied to the base terminal of the high-side transistor Q1. A voltage V35 is applied to the emitter terminal of the high-side transistor Q1. A control voltage output from a low-side control voltage output unit 31 to be described later is applied to the base terminal of the low-side transistor Q2. A voltage V39 is applied to the emitter terminal of the low-side transistor Q2.

The control voltage supply unit 30 outputs a first control voltage lower than the reference voltage applied to one terminal of the inverter unit 50 and a second control voltage higher than the reference voltage, thus controls the switching of the inverter unit 50. Here, the control voltage supply unit 30 may include a control voltage output unit 35 for outputting the first control voltage and the second control voltage, voltage difference deciding units 36 and 37, a voltage source 39, and a controller 40 for controlling the control voltage output unit 35.

Here, the voltage source 39 outputs a base voltage for deciding the levels of the first voltage and the second voltage to the control voltage output unit 35. In the drawing, an example where the voltage source 39 outputs a voltage Vcc is illustrated.

The voltage difference deciding units 36 and 37, whose anodes are connected to the emitter terminal of a transistor included in the inverter unit 50 and whose cathodes are connected to one terminal of the control voltage output unit 35, decide a voltage difference between the second control voltage and a voltage applied to the emitter terminal of the transistor. Here, the voltage difference deciding units 36 and 37 may include at least one of a zener diode and a capacitor. However, the present invention is not limited to this, and the voltage difference deciding units 36 and 37 include an arbitrary device which can adjust the voltage difference between the second control voltage and the voltage applied to the emitter terminal of the transistor. The voltage difference deciding units 36 and 37 may be separately provided in correspondence to the high-side inverter unit 51 and the low-side inverter unit 53 respectively. The zener diode Dz and a resistor Rd which is serial-connected to the zener diode Dz may be connected in parallel to the voltage source 39. As illustrated in FIG. 2, capacitors C1, C2, and C3 are connected in parallel to the zener diode Dz and the resistor Rd to stabilize the circuit.

For example, if the zener diode Dz has a capacity of 6.2V and the voltage Vcc of the voltage source 39 is higher than 6.2V, a voltage of 6.2V is applied at the zener diode Dz. If the switching unit Qb is turned on, the capacitor Cneg is charged. If the voltage of 6.2V is applied to the capacitor Cneg, the voltage V35 becomes higher by 6.2V than the voltage V33.

Here, the switching unit Qb is included in the control voltage supply unit 30, and may be serial-connected to an output terminal of the low-side control voltage output unit 31 which will be described later and to one terminal of the voltage difference deciding unit 36 and one terminal of the voltage difference deciding unit 37 near the high-side control voltage output unit 33 to be described later.

The control voltage output unit 35 outputs a control voltage to the inverter unit 50 and controls the inverter unit 50. Here, the control voltage output unit 35 may include the high-side control voltage output unit 33 corresponding to the high-side inverter unit 51 and the low-side control voltage output unit 31 corresponding to the low-side inverter unit 53. Here, the control voltage output unit 35 may include a first voltage terminal for deciding the first control voltage by the voltage source 39 and a second voltage terminal for deciding the second control voltage.

The high-side control voltage output unit 33 outputs a first high-side control voltage lower than a high-side reference voltage, that is, the voltage applied to the emitter terminal of the high-side transistor Q1, and a second high-side control voltage higher than the high-side reference voltage, to the high-side inverter unit 51. The high-side control voltage output unit 33 includes a first high-side voltage terminal for deciding the first high-side control voltage and a second high-side voltage terminal for deciding the second high-side control voltage. The low-side control voltage output unit 31 outputs a first low-side control voltage lower than a low-side reference voltage, that is, the voltage applied to the emitter terminal of the low-side transistor Q2, and a second low-side control voltage higher than the low-side reference voltage, to the low-side inverter unit 53. The low-side control voltage output unit 31 includes a first low-side voltage terminal for deciding the first low-side control voltage and a second low-side voltage terminal for deciding the second low-side control voltage.

The control voltage output unit 35, for example, may include a push-pull type gate driver, an OP amplifier, a comparator, etc. The control voltage output unit 35 may output a first control voltage corresponding to a low signal and a second control voltage corresponding to a high signal, according to a control signal of the controller 40 which will be described later. Here, the voltage of the low signal is decided according to the voltages V31 and V33 applied to the first voltage terminal, and the voltage of the high signal is decided according to the voltages V32 and V34 applied to the second voltage terminal.

A voltage applied to the second voltage terminal of the high-side control voltage output unit 33 is V34, and is similar to the voltage Vcc output from the voltage source 39 if the resistance of the resistor Rbs is small. A voltage applied to the first voltage terminal of the high-side control voltage output unit 33 is V33, and is equal to V11 if the transistor Qb is turned on.

A voltage applied to the second voltage terminal of the low-side control voltage output unit 31 is V32, and the voltage V32 is equal to Vcc. A voltage applied to the first voltage terminal of the low-side control voltage output unit 31 is V31 and is equal to the voltage V11.

The controller 40 may control the high-side control voltage output unit 33 and the low-side control voltage output unit 31 to output one of the first control voltage and the second control voltage. For example, the controller 40 may output a pulse width modulation (PWM) signal having a value 0 or 1 to the control voltage output unit 35. If the pulse width modulation signal has a value 1, the control voltage output unit 35 may output a high signal. If the pulse width modulation signal has a value 0, the control voltage output unit 35 may output a low signal. Here, it is also possible that the control voltage output unit 35 outputs a low signal according to a pulse width modulation signal having a value 1 and outputs a high signal according to a pulse width modulation signal having a value 0. Hereinafter, an example where the control voltage output unit 35 outputs a high signal when the pulse width modulation signal has a value 1, and outputs a low signal when the pulse width modulation signal has a value 0, will be described.

The controller 40 may control so that the high-side inverter unit 51 and the low-side inverter unit 53 are not simultaneously turned on, that is, so that the high-side control voltage output unit 33 and the low-side control voltage output unit 31 do not simultaneously output a high signal.

The on/off operations of the transistors are controlled according to voltages applied to the base terminals of the transistors and voltages applied to the emitter terminals of the transistors. For example, in npn transistors Q1 and Q2 illustrated in FIG. 2, if voltages applied to the base terminals of the transistors Q1 and Q2 are higher than voltages applied to the emitter terminals of the transistors Q1 and Q2, the transistors Q1 and Q2 are turned on. If voltages applied to the base terminals of the transistors Q1 and Q2 are lower than voltages applied to the emitter terminals of the transistors Q1 and Q2, the transistors Q1 and Q2 are turned off. In this embodiment, the transistors Q1 and Q2 are npn transistors. However, the present invention is not limited to this and the transistors Q1 and Q2 can be pnp transistors whose on/off states are opposite to the on/off states of npn transistors. Hereinafter, an example where the transistors Q1 and Q2 are npn transistors is described.

Hereinafter, an example where a voltage of 6.2V is applied to the zener diode Dz, the voltage Vcc of the voltage source 39 is 20V, the voltage V11 is 0V, the voltage V34 is about 20V with respect to the voltage V33, and the voltage charged in the capacitor Cneg is 6.2V, will be described. As illustrated in FIG. 2, the zener diode Dz and the resistor Rd serial-connected to the zener diode Dz are connected in parallel to the voltage source 39. Here, a voltage of 13.8V (=20V−6.2V) is applied to the resistor Rd.

Here, a voltage applied to the second voltage terminal of the low-side control voltage output unit 31 is 20V, and a voltage applied to the first voltage terminal of the low-side control voltage output unit 31 is 0V. Also, a voltage applied to the emitter terminal of the low-side transistor Q2 is 6.2V. In this case, if a pulse width modulation signal having a value 1 is applied from the controller 40 to the control voltage output unit 35, the low-side control voltage output unit 31 outputs a voltage 20V corresponding to V32 so that the low-side transistor Q2 is turned on. If a pulse width modulation signal having a value 0 is applied to the control voltage output unit 35 from the controller 40, the low-side control voltage output unit 31 outputs a voltage 0V corresponding to V31. At this time, a voltage of 6.2V corresponding to V39 is applied to the emitter terminal of the low-side transistor Q2. Accordingly, since the control voltage applied to the base terminal of the low-side transistor Q2 is lower by 6.2V than a voltage of the emitter terminal of the low-side transistor Q2, the low-side transistor Q2 is turned off. If the low-side transistor Q2 is turned off, the gate-emitter voltage of the low-side transistor Q2 will have a negative value corresponding to a voltage V39-V37 applied to the cathode and anode of the zener diode Dz. Here, since a supply voltage is always applied to the low-side transistor Q2, the low-side transistor Q2 can be switched anytime by applying a control signal to the low-side control voltage output unit 31. However, in order to turn on/off the high-side transistor Q1, it is needed to charge bootstrap capacitors Cneg and Cpos.

A driving voltage applied to the motor 90 varies between voltages Vdc+ and Vdc− by the power supply unit 70. However, regardless of the driving voltage, the voltages of the capacitors Cneg and Cpos must be maintained.

Here, if a high signal is output from the low-side control voltage output unit 31, the MOS transistor Qb as well as the low-side transistor Q2 is turned on. At this time, if the MOS transistor Qb is turned on, the capacitors Cneg and Cpos are charged. That is, a voltage Vz applied to the zener diode Dz is charged in the capacitor Cneg and a voltage of Vcc-Vz is charged in the capacitor Cpos.

If the low-side transistor Q2 is turned on, the voltage V35 becomes equal to V39 (that is, 6.2V) and the voltage V33 becomes equal to V11 (that is, 0V). Also, the voltage V34 is about 20V.

Accordingly, the voltage applied to the second voltage terminal of the high-side control voltage output unit 33 is about 20V, and the voltage V33 applied to the first voltage terminal of the high-side control voltage output unit 33 is 0V. Also, the voltage V35 applied to the emitter terminal of the high-side transistor Q1 is 6.2V. In this case, if a pulse width modulation signal having a value 1 is applied to the control voltage output unit 35 from the controller 40, the high-side control voltage output unit 33 outputs about 20V corresponding to V32 so that the low-side transistor Q2 is turned on. If a pulse width modulation signal having a value 0 is applied from the controller 40 to the control voltage output unit 35, the high-side control voltage output unit 33 outputs 0V corresponding to V33. At this time, the voltage V35, that is, 6.2V is applied to the emitter terminal of the high-side transistor Q1. Accordingly, since a control voltage applied to the base terminal of the high-side transistor Q1 is lower by 6.2V than a voltage applied to the emitter terminal of the high-side transistor Q1, the high-side transistor Q1 is turned off. That is, if the high-side transistor Q1 is turned off, the gate-emitter voltage of the high-side transistor Q1 will have a negative value corresponding to a voltage V33-V35 applied to the capacitor Cneg.

Figure 3:
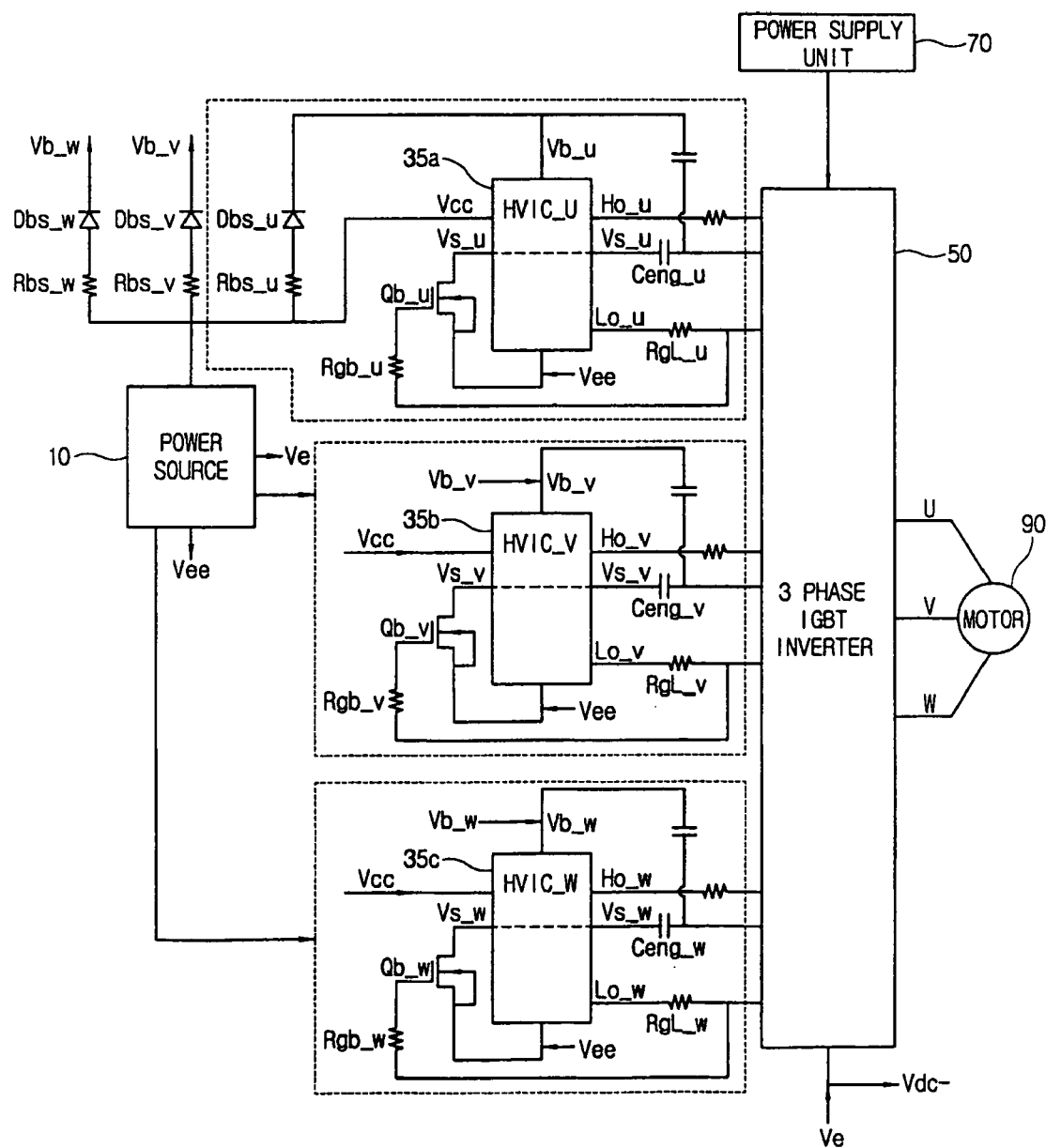
FIG. 3 is a control block diagram of an electronic apparatus including a three-phase motor and a power circuit for driving the three-phase motor, according to an embodiment of the present invention.

FIG. 3 is a control block diagram of an electronic apparatus including a three-phase motor 90, according to an embodiment of the present invention.

As illustrated in FIG. 3, the electronic apparatus according to the present invention may include a power circuit for driving the three-phase motor 90.

That is, in a case where the electronic apparatus and a power circuit according to the present invention drive the three-phase motor 90, three power circuits, each power circuit having a configuration illustrated in FIG. 2, can be provided. FIG. 3 illustrates a power source 10, however, three power sources respectively corresponding to control voltage output units 35a, 35b, and 35c may be provided. Here, the power source 10 includes the zener diode Dz and the voltage source 39 as illustrated in FIG. 2. The control voltage output units 35a, 35b, and 35c respectively correspond to High Voltage Integrated Circuits (HVICs: HVIC_U, HVIC_V, and HVIC_W).

A three-phase IGBT inverter unit 50 may provide three-phase voltages Vu, Vv, and Vw to the three-phase motor 90. The three control voltage output units 35a, 35b, and 35c may control the inverter unit 50 to provide voltages having different phases.

Figure 4:
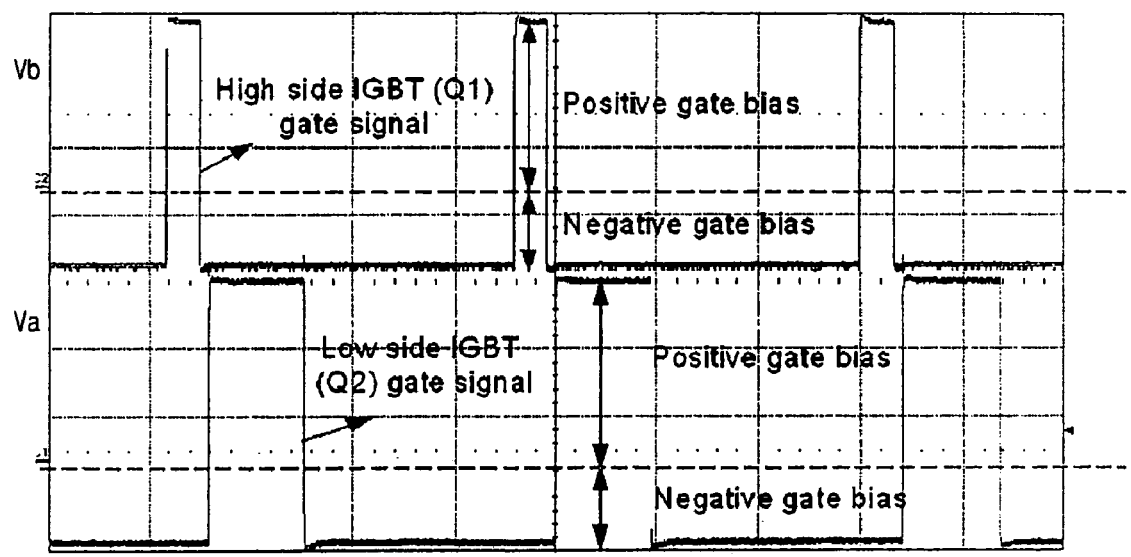
FIG. 4 is a graph plotting a control voltage output from a control voltage output unit according to the present invention.

FIG. 4 is a graph plotting a change according to time in control voltage output from a control voltage output unit 35.

As illustrated in FIG. 4, control voltages applied to the gate terminals of the high-side transistor Q1 and the low-side transistor Q2 do not simultaneously output a high signal. This is described above with reference to FIG. 2.

If a high signal is output from the high-side control voltage output unit 33, the voltage applied to the gate terminal of the high-side transistor Q1 increases by a positive gate bias voltage with respect to a voltage applied to the emitter terminal of the high-side transistor Q1. If a low signal is output from the high-side control voltage output unit 33, the voltage applied to the gate terminal of the high-side transistor Q1 decreases by a negative gate bias voltage with respect to the voltage applied to the emitter terminal of the high-side transistor Q1.

Meanwhile, if a high signal is output from the low-side control voltage output unit 31, the voltage applied to the gate terminal of the low-side transistor Q2 increases by the positive gate bias voltage with respect to the voltage applied to the emitter terminal of the low-side transistor Q2. If a low signal is output from the low-side control voltage output unit 31, the voltage applied to the gate terminal of the low-side transistor Q2 decreases by the negative gate bias voltage with respect to the voltage applied to the emitter terminal of the low-side transistor Q2.

Figure 5:
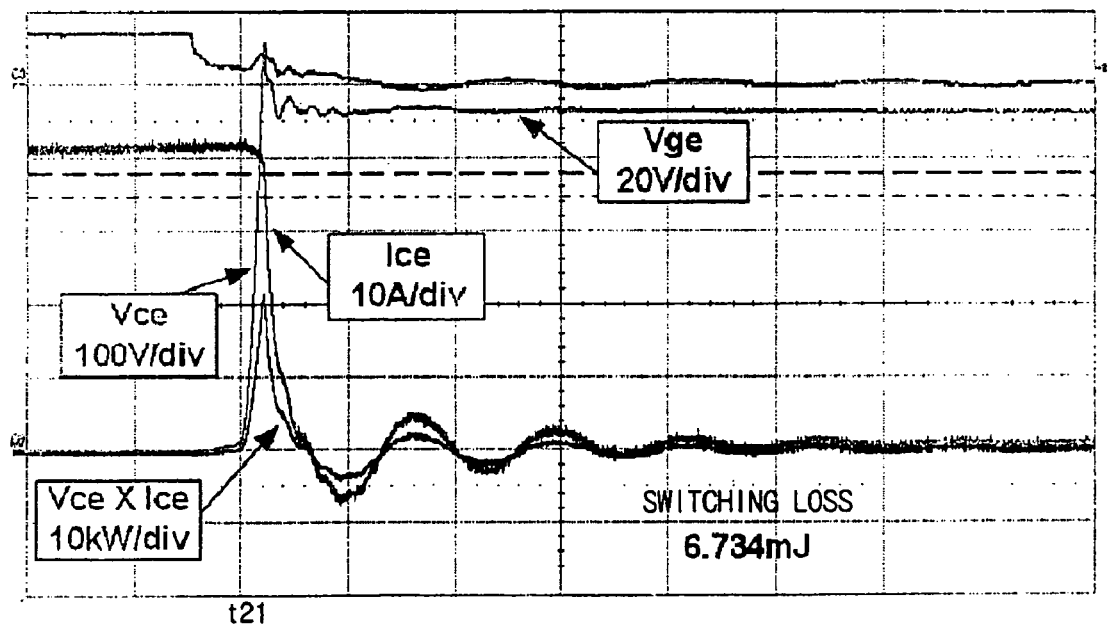
FIG. 5 is a graph plotting changes in current, voltage, and power loss according to time, in an inverter unit of the power circuit according to the present invention.

FIG. 5 is a graph plotting switching loss of the electronic apparatus according to the present invention.

In FIG. 5, Vge is a voltage applied to the gate and emitter terminals of a transistor, Ice is a current passing through the collector and emitter terminals of the transistor, and Vce is a voltage applied to the collector and emitter terminals of the transistor. Here, switching loss of the transistor corresponds to Vce×Ice.

As illustrated in the graph of FIG. 5, values of Vge, Ice, and Vce greatly change at a time t21 when the transistor is switched. Here, it is obtained through an experiment that the switching loss of the transistor is 6.734 mJ.

Figure 1B:
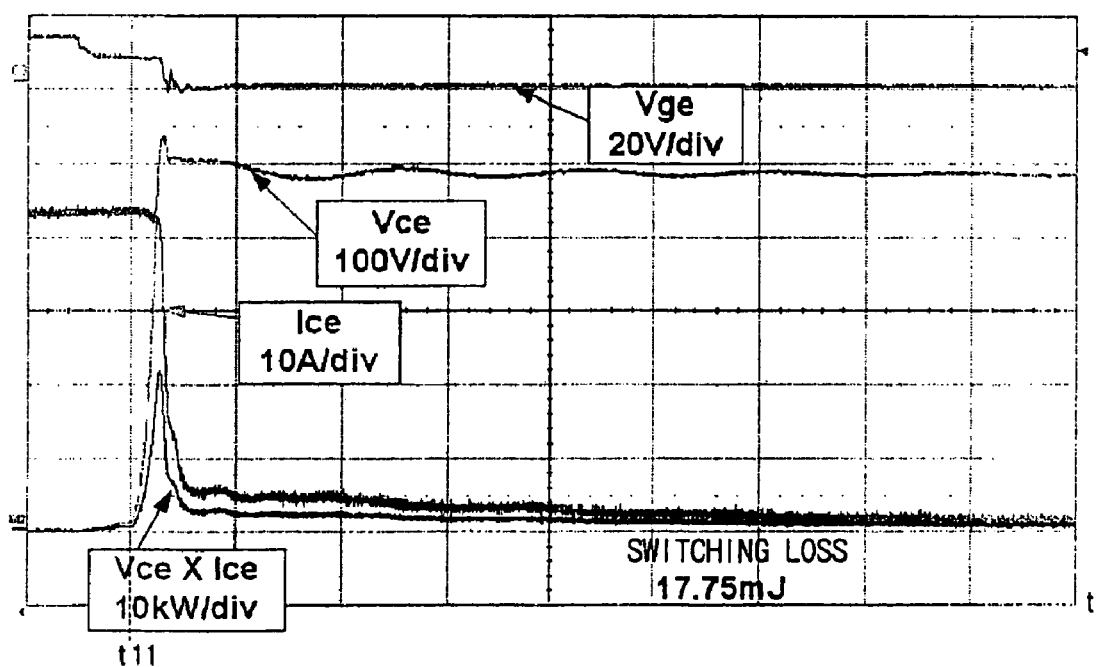
FIG. 1B is a graph plotting changes in current, voltage, and power according to time, in an inverter unit of the conventional power circuit.

FIG. 1B is a graph illustrating switching loss of a conventional electronic apparatus, wherein a switching time of the transistor is t11, and it is obtained through an experiment that the switching loss of the transistor is 17.75 mJ.

As such, in the electronic apparatus according to the present invention, switching loss by switching of the inverter unit 50 is significantly reduced compared to the conventional electronic apparatus. Also, in the electronic apparatus according to the present invention, after the transistor is switched, the time when a value of the Vce×Ice reaches a value of the Vce×Ice before switching times t21 and t11, is much shorter than in the conventional electronic apparatus.

As described above, an electronic apparatus according to the present invention can reduce switching loss of transistors of an inverter unit by allowing a control voltage output unit 35 to apply a voltage lower than a voltage applied to the emitter terminals of the transistors of the inverter unit 50 to the base terminals of the transistors of the inverter unit 50.

As described above, in the electronic apparatus and power circuit according to the present invention, since a control voltage output from the control voltage output unit to the inverter unit is higher or lower than a predetermined reference voltage, it is possible to reduce switching loss of the inverter unit.

Although a few exemplary embodiments of the present invention have been shown and described, it will be appreciated by those skilled in the art that changes may be made in these embodiments without departing from the principles and spirit of the invention, the scope of which is defined in the appended claims and their equivalents.

What is claimed is:

1. A power circuit comprising:
a power supply unit supplying a driving voltage to a load;
an inverter unit switching the driving voltage; and
a control voltage supply unit outputting a first control voltage lower than a reference voltage applied to one terminal of the inverter unit and a second control voltage higher than the reference voltage, thus controlling the inverter unit,
wherein the inverter unit comprises at least one transistor having a base terminal, an emitter terminal, and a collector terminal,
the reference voltage is a voltage of the emitter terminal of the transistor, and the first control voltage and the second control voltage are applied to the base terminal of the transistor,
the control voltage supply unit comprises a control voltage output unit comprising a first voltage terminal for deciding the first control voltage and a second voltage terminal for deciding the second control voltage, and
the control voltage supply unit comprises a voltage difference deciding unit whose cathode is connected to the emitter terminal of the transistor and whose anode is connected to the first voltage terminal, to decide a voltage difference between a voltage of the emitter terminal of the transistor and a voltage of the first voltage terminal.

2. The power circuit according to claim 1, wherein the voltage difference deciding unit comprises at least one of a zener diode and a capacitor.

3. The power circuit according to claim 2, wherein the transistor comprises an Insulated Gate Bipolar Transistor (IGBT).

4. An electronic apparatus having a load comprising:
a power supply unit supplying a driving voltage to the load;
an inverter unit switching the driving voltage; and
a control voltage supply unit outputting a first control voltage lower than a reference voltage applied to one terminal of the inverter unit, and a second control voltage higher than the reference voltage, thus controlling the inverter unit, wherein:
the inverter unit comprises at least one transistor having a base terminal, an emitter terminal, and a collector terminal,
the reference voltage is a voltage of the emitter terminal of the transistor, and the first control voltage and the second control voltage are applied to the base terminal of the transistor,
the control voltage supply unit comprises a control voltage output unit comprising a first voltage terminal for deciding the first control voltage and a second voltage terminal for deciding the second control voltage,
the control voltage supply unit comprises a voltage difference deciding unit whose cathode is connected to the emitter terminal of the transistor and whose anode is connected to the first voltage terminal, to decide a voltage difference between a voltage of the emitter terminal of the transistor and a voltage of the first voltage terminal.

5. The electronic apparatus according to claim 4, wherein the voltage difference deciding unit comprises at least one of a zener diode and a capacitor.

6. The electronic apparatus according to claim 4, wherein:
the inverter unit comprises a high-side inverter unit and a low-side inverter unit, and
the control voltage output unit comprises:
a high-side control voltage output unit outputting a first high-side control voltage lower than a high-side reference voltage and a second high-side control voltage higher than the high-side reference voltage, to the high-side inverter unit, and comprising a first high-side voltage terminal for deciding the first high-side control voltage and a second high-side voltage terminal for deciding the second high-side control voltage, and
a low-side control voltage output unit outputting a first low-side control voltage lower than a low-side reference voltage and a second low-side control voltage higher than the low-side reference voltage, to the low-side inverter unit, and comprising a first low-side voltage terminal for deciding the first low-side control voltage and a second low-side voltage terminal for deciding the second low-side control voltage.

7. The electronic apparatus according to claim 6, wherein:
the high-side inverter unit comprises a high-side transistor, and
the low-side inverter unit comprises a low-side transistor.

8. The electronic apparatus according to claim 7, wherein the control voltage supply unit further comprises a controller which controls the low-side control voltage output unit to output the second low-side control voltage if the high-side control voltage output unit outputs the first high-side control voltage, and controls the low-side control voltage output unit to output the first low-side control voltage if the high-side control voltage output unit outputs the second high-side control voltage.

9. The electronic apparatus according to claim 8, wherein the voltage difference deciding unit is provided in correspondence to at least one of the low-side control voltage output unit and the high-side control voltage output unit.

10. The electronic apparatus according to claim 9, wherein the voltage difference deciding unit comprises a low-side voltage difference deciding unit provided in the low-side control voltage output unit and a high-side voltage difference deciding unit provided in the high-side control voltage output unit.

11. The electronic apparatus according to claim 10, wherein:
the control voltage supply unit comprises a switching unit which is serial-connected to an output terminal of the low-side control voltage output unit and one terminal of the high-side voltage difference deciding unit, and
the high-side voltage difference deciding unit comprises a capacitor which is charged when the second low-side control voltage is output.

12. The electronic apparatus according to claim 11, wherein the first high-side control voltage is lower by a voltage charged in the capacitor than a voltage of the emitter terminal of the high-side transistor.

13. The electronic apparatus according to claim 10, wherein:
the low-side voltage difference deciding unit comprises a zener diode, and
a voltage of one terminal of the low-side voltage difference deciding unit is lower by a voltage applied to the zener diode than a voltage of the emitter terminal of the low-side transistor.

14. The electronic apparatus according to claim 10, wherein the control voltage supply unit comprises a voltage source supplying a voltage to the second high-side voltage terminal and the second low-side voltage terminal.

15. The electronic apparatus according to claim 14, wherein the voltage source is connected in parallel to the low-side voltage difference deciding unit.

16. The electronic apparatus according to claim 15, wherein each of the at least one transistors comprises an Insulated Gate Bipolar Transistor (IGBT).

17. The electronic apparatus according to claim 16, wherein the load comprises a motor.

18. The electronic apparatus according to claim 17, wherein the motor comprises a three-phase motor, and the controller controls the control voltage output unit, to output a control voltage for providing a three-phase current to respective phase terminals of the three-phase motor, to the inverter unit.

* * * * *

UNITED STATES PATENT AND TRADEMARK OFFICE
CERTIFICATE OF CORRECTION

| | |
|---|---|
| PATENT NO. | : 7,535,740 B2 |
| APPLICATION NO. | : 11/546438 |
| DATED | : May 19, 2009 |
| INVENTOR(S) | : Won-kyoung Lee |

Page 1 of 1

It is certified that error appears in the above-identified patent and that said Letters Patent is hereby corrected as shown below:

Column 10, Lines 49-50 Claim 6, change
"low-side inverter unit, and
the control voltage output unit comprises:" to
--low-side inverter unit, and the control voltage output unit comprises:--.

Signed and Sealed this

First Day of September, 2009

David J. Kappos
*Director of the United States Patent and Trademark Office*